(12) United States Patent
Kim

(10) Patent No.: US 11,437,556 B2
(45) Date of Patent: *Sep. 6, 2022

(54) GRAPHITE-LAMINATED CHIP-ON-FILM-TYPE SEMICONDUCTOR PACKAGE ALLOWING IMPROVED VISIBILITY AND WORKABILITY

(71) Applicant: Hag Mo Kim, Yongin-Si (KR)

(72) Inventor: Hag Mo Kim, Yongin-Si (KR)

(73) Assignee: Hag Mo Kim, Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/640,680

(22) PCT Filed: Aug. 21, 2018

(86) PCT No.: PCT/KR2018/009624
§ 371 (c)(1),
(2) Date: Feb. 20, 2020

(87) PCT Pub. No.: WO2019/039848
PCT Pub. Date: Feb. 28, 2019

(65) Prior Publication Data
US 2020/0355958 A1 Nov. 12, 2020

(30) Foreign Application Priority Data
Aug. 21, 2017 (KR) .................. 10-2017-0105442

(51) Int. Cl.
*H01L 33/64* (2010.01)
*G02F 1/1345* (2006.01)
(Continued)

(52) U.S. Cl.
CPC ........ *H01L 33/641* (2013.01); *G02F 1/13452* (2013.01); *H01L 23/3735* (2013.01);
(Continued)

(58) Field of Classification Search
CPC .. H01L 23/3737; H01L 33/641; H01L 33/644
See application file for complete search history.

(56) References Cited

U.S. PATENT DOCUMENTS 9,070,680 B2 * 6/2015 Kim ..................... H01L 23/4985
11,355,687 B2 * 6/2022 Kim ..................... H01L 23/498

FOREIGN PATENT DOCUMENTS

KR 10-2010-0135161 A 12/2010
KR 10-1188084 B1 10/2012
(Continued)

OTHER PUBLICATIONS

International Search Report from Application No. PCT/KR2018/009623 dated Dec. 20, 2018.
(Continued)

*Primary Examiner* — David A Zarneke
(74) *Attorney, Agent, or Firm* — Polsinelli PC

(57) ABSTRACT

The present invention relates to a chip-on film type semiconductor package including an integrated circuit chip, a printed circuit board layer, an outer lead bonder pad, and a graphite layer, in which the integrated circuit chip is connected to one surface of the printed circuit board layer directly or by means of a mounting element, the outer lead bonder pad is located on one surface of the printed circuit board layer, and the graphite layer is laminated on an opposite surface of the printed circuit board layer and a display device including the same.

16 Claims, 18 Drawing Sheets

(51) Int. Cl.
*H01L 23/00* (2006.01)
*H01L 23/373* (2006.01)
*H01L 23/498* (2006.01)
*H01L 23/552* (2006.01)
*G02F 1/1333* (2006.01)

(52) U.S. Cl.
CPC .... *H01L 23/3737* (2013.01); *H01L 23/49822* (2013.01); *H01L 23/49838* (2013.01); *H01L 23/49877* (2013.01); *H01L 23/552* (2013.01); *H01L 24/10* (2013.01); *H01L 33/644* (2013.01); *G02F 1/133308* (2013.01); *H01L 24/02* (2013.01); *H01L 2224/02* (2013.01); *H01L 2224/10* (2013.01); *H01L 2224/16225* (2013.01); *H01L 2224/73204* (2013.01); *H01L 2224/81* (2013.01); *H01L 2924/15* (2013.01); *H01L 2924/1517* (2013.01); *H01L 2924/15763* (2013.01); *H01L 2924/15786* (2013.01)

(56) References Cited

FOREIGN PATENT DOCUMENTS

| KR | 10-2012-0122266 A | 11/2012 |
| KR | 10-2017-0008981 A | 1/2017 |
| KR | 10-2017-0019023 A | 2/2017 |
| KR | 10-2017-0026715 A | 3/2017 |
| KR | 10-2018-0034198 A | 4/2018 |
| KR | 10-2018-0097718 A | 8/2018 |

OTHER PUBLICATIONS

Notification of Reason for Refusal from KR Application No. 10-2018-0097718 dated Nov. 25, 2019.
English abstract of KR20120122266; retrieved from www.espacenet.com on Feb. 17, 2020.
English abstract of KR20170008981; retrieved from KIPRIS on Feb. 18, 2020.
English abstract of KR101188084; retrieved from www.espacenet.com on Feb. 17, 2020.
English abstract of KR20170026715; retrieved from KIPRIS on Feb. 18, 2020.
English abstract of KR20170019023; retrieved from www.espacenet.com on Feb. 17, 2020.
English abstract of KR20180034198; retrieved from www.espacenet.com on Feb. 17, 2020.
English abstract of KR20100135161; retrieved from www.espacenet.com on Feb. 17, 2020.
English abstract of KR20180097718; retrieved from www.espacenet.com on Feb. 17, 2020.

* cited by examiner

GRAPHITE-LAMINATED CHIP-ON-FILM-TYPE SEMICONDUCTOR PACKAGE ALLOWING IMPROVED VISIBILITY AND WORKABILITY

CROSS-REFERENCE TO RELATED APPLICATIONS

This application is a national stage application of PCT/KR2018/009624, which was filed on Aug. 21, 2018, which claims priority to Korean Application Number 10-2017-0105442 filed on Aug. 21, 2017, of which is incorporated by reference in its entirety.

TECHNICAL FIELD

The present invention relates to a display device and a graphite laminate chip-on film type semiconductor package which is a major component which drives a display.

The present application claims priority from Korean Patent Application No. 10-2017-0105442, filed on Aug. 21, 2017 at the KIPO, the disclosure of which is incorporated herein by reference in its entirety.

BACKGROUND ART

Recently, as interest in high resolution displays has increased, a heat generation amount at the time of driving a driver integrated circuit, in particular, a display driver integrated circuit chip, increases, which causes the temperature rise to be in the operating range or higher, thereby affecting an image quality of the display, inhibiting a normal operation, or causing breakage due to high temperature to shorten its lifespan.

In such a high resolution display, until now, the heat dissipation effect has been tried in a different way, but the effect is reaching its limit, and a more innovative method is required.

Not only in mobile phones which are represented by smart phones, but also in TVs and computers which have improved performances, a driver integrated circuit is affected due to an electromagnetic interference caused by an RF-related module among corresponding modules or an electromagnetic interference generated in an integrated circuit chip which operates at a high speed so that a noise is generated from a liquid crystal panel or an OLED panel or discoloration problem is frequently generated. Further, as compared with the related art, an LCD screen is very large and a screen frequency is getting very high, which may generate a large noise on the screen due to the effect of the fine electromagnetic interference.

Further, the characteristic of the liquid crystal display driving integrated circuit is also improved as compared with the related art to be operated at a high speed with a high frequency so that the EMI generated in the driving integrated circuit affects an image quality of the liquid crystal display or affects another integrated circuit chip.

Therefore, a shielding technique for protecting a display driving integrated circuit from the electromagnetic interference or protecting another integrated circuit chip from the electromagnetic interference generated from the display driving integrated circuit is demanded.

In the meantime, when a graphite material having excellent heat radiation and electromagnetic shielding performance is used to configure a heat radiating layer, a visibility of an outer lead bonder pad disposed on one surface of a printed circuit board is degraded in a direction of the heat radiating layer so that a precision of the bonding process is degraded and a bonding strength is lowered. Therefore, it is difficult to apply the graphite material as a heat radiating layer.

DISCLOSURE

Technical Problem

The present invention is provided to improve and solve a heat generating problem and an electromagnetic interference problem during an operation of a driver integrated circuit chip of a high resolution display and provides a chip-on film type semiconductor package and a display device including the same which solve degradation of a visibility of a heat radiating layer and improve the precision and the bonding strength during the process of bonding the semiconductor package while effectively radiating heat generated from a driver integrated circuit chip.

Technical Solution

The present invention provides a chip-on film type semiconductor package including an integrated circuit chip, a printed circuit board layer, an outer lead bonder pad, and a graphite layer in which the integrated circuit chip is connected to one surface of the printed circuit board layer directly or by means of a mounting element, the outer lead bonder pad is located on one surface of the printed circuit board layer, and the graphite layer is laminated on an opposite surface of the printed circuit board layer.

Further, the present invention provides a display device including the chip-on film type semiconductor package, a substrate, and a display panel.

Advantageous Effect

A chip-on film type semiconductor package according to the present invention and a display device including the same may externally radiate the heat of the integrated circuit chip which affects an operation and an image quality of the display to minimize the effect.

Further, the operation is stabilized to be an optimal state by preventing the temperature of the integrated circuit chip from being high so that an image quality of the display is also maintained in an optimal state and the breakage of the driver integrated circuit chip due to a high temperature is reduced to increase a lifespan of the driver integrated circuit chip, thereby extending the lifespan of the display.

Specifically, the graphite is laminated on a printed circuit board so that not only a heat radiation effect which quickly radiates the heat generated from a circuit component to an opposite direction, but also a conductive characteristic of the graphite allows an excellent electromagnetic interference shielding effect and a function of the display driving integrated circuit chip to be constantly maintained without being degraded and also may prevent a function of another integrated circuit chip from being degraded.

Therefore, a lifespan of the driving integrated circuit chip is extended while consistently maintaining an image quality of the display to also extend the lifespan of the display.

Further, even though a graphite which significantly degrades a visibility is laminated on an opposite side of the film when the bonding process is performed, the visibility at the opposite side of the film is improved so that an outer lead bonder pad at the opposite direction of the film is identified even in the graphite layer direction with naked eyes so that a bonding precision and a bonding strength at the time of bonding a chip-on film type semiconductor package and a display substrate may be improved.

DESCRIPTION OF MAIN REFERENCE NUMERALS OF DRAWINGS

Figure 1:
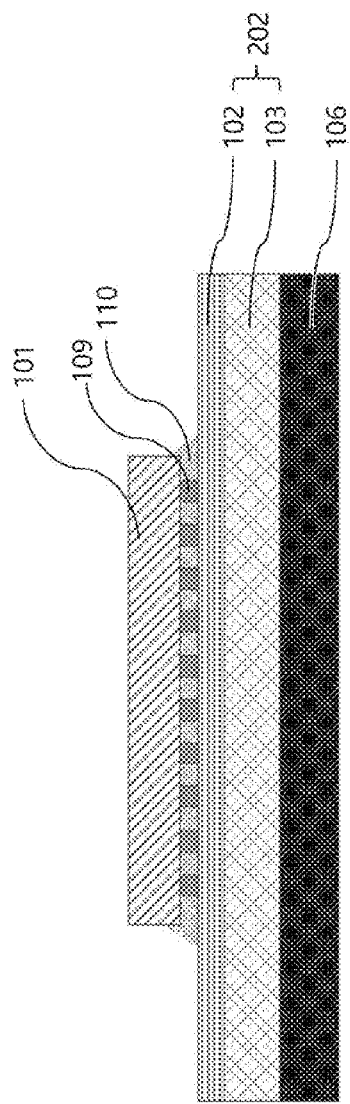
FIG. 1 illustrates an example of a cross-section of a chip-on film type semiconductor package in which a direction mounting element 109 is disposed on one surface of a circuit pattern layer 123 of a printed circuit board layer 202, a filling material 100 is filled in an empty space, and then an integrated circuit chip 101 is laminated, on a film on which a graphite layer 106 is laminated on one surface of a base material unit 103 of the printed circuit board layer 202.

101: Driver integrated circuit chip
102: Circuit pattern layer of printed circuit film layer
103: Base material layer of printed circuit film layer
104, 107: Adhesive layer
105, 108: Protective film layer
106, 203: Graphite layer
109: Bump for electrically connecting driver integrated circuit chip and printed circuit film
110: Filler
202: Printed circuit film layer
301: Roller
302: Graphite powder
401: Graphite film Best Mode Hereinafter, exemplary embodiments of a chip-on film type semiconductor package according to the present invention and a manufacturing method thereof will be described in detail with reference to the accompanying drawings to be easily carried out by those skilled in the art.

Hereinafter, a chip-on film type semiconductor package according to the present invention and a manufacturing method thereof will be described with reference to the accompanying drawings.

Hereinafter, a configuration and characteristics of the present invention will be described by way of exemplary embodiments, which are not intended to be limiting, but merely illustrative of the invention.

Hereinafter, a structure of a chip-on film type semiconductor package will be described with reference to FIG. 1.

A chip-on film type semiconductor package according to the present invention includes an integrated circuit chip 101, a printed circuit board layer 202, an outer lead bonder pad, and a graphite layer 106.

The integrated circuit chip 101 is connected to one surface of the printed circuit board layer 202 directly or by means of a mounting element 109. As long as the mounting element 109 electrically connects a circuit of the printed circuit board layer 202 and the integrated circuit chip 101, the mounting element is not limited. However, specifically, the mounting element 109 may be a bump and a material may be gold, copper, nickel, or a combination thereof.

In one embodiment of the present invention, the printed circuit board layer 202 may include a circuit pattern layer 102 and a base material unit 103. The circuit pattern layer 102 may be a pattern which configures an electrical circuit with the integrated circuit chip 101 and the material is not limited as long as a material configures a circuit. However, the material may be gold, copper, nickel, or a combination thereof. If the base material unit 103 is an insulating material, the material is not limited. However, the base material unit may be a flexible film or a transparent film having a visible plate to surface structure. Specifically, the base material unit may be a polyimide film.

In one embodiment of the present invention, a thickness of the printed circuit board layer 202 may be 25 µm to 50 µm. If the thickness is less than 25 µm, the strength against the bending or tearing is degraded and if the thickness is more than 50 µm, the flexibility is degraded so that the bending property may be deteriorated.

In one embodiment of the present invention, an exposed area of the mounting element 109 between the integrated circuit chip 101 and the printed circuit board layer 202 may be filled with a filler 110. As long as the filler 110 suppresses the oxidation of the mounting element 109 due to exposure to the air, the filler is not limited, but specifically, may be a liquid resin.

Figure 2:
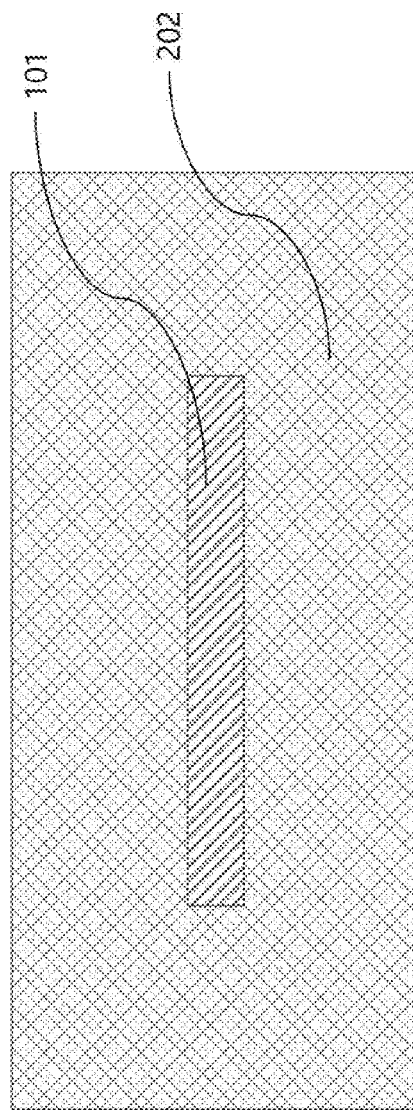
FIG. 2 illustrates a structure in which an integrated circuit chip 101 is connected to one surface of a printed circuit board layer 202 directly or by means of a mounting element 109 as a plan view in an upper direction of a chip-on film type semiconductor package.

FIG. 2 illustrates a structure in which an integrated circuit chip 101 is connected to one surface of a printed circuit board layer 202 directly or by means of a mounting element 109 as a plan view in an upper direction of a chip-on film type semiconductor package.

In one embodiment of the present invention, the integrated circuit chip 101 may be a display driver integrated circuit chip (DDI chip).

The graphite layer 106 may be laminated on an opposite surface of the printed circuit board layer 202.

Figure 3:
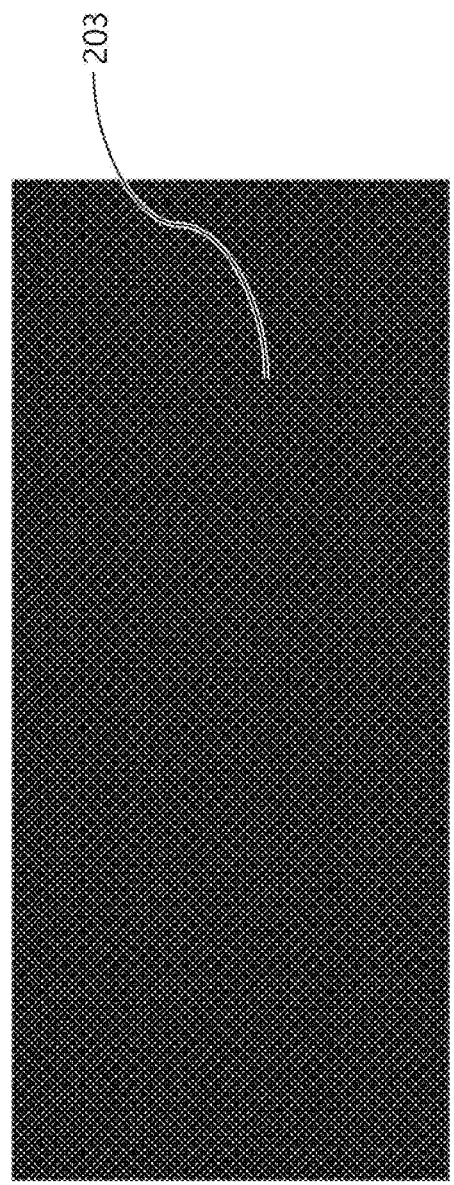
FIG. 3 illustrates a plan view of a lower direction of a chip-on film type semiconductor package in which a graphite layer is laminated.

FIG. 3 illustrates a plan view of a lower direction of a chip-on film type semiconductor package in which a graphite layer is laminated.

In one embodiment of the present invention, the graphite layer 106 may be a carbonized polymer film or a film formed of graphite powder.

Figure 4:
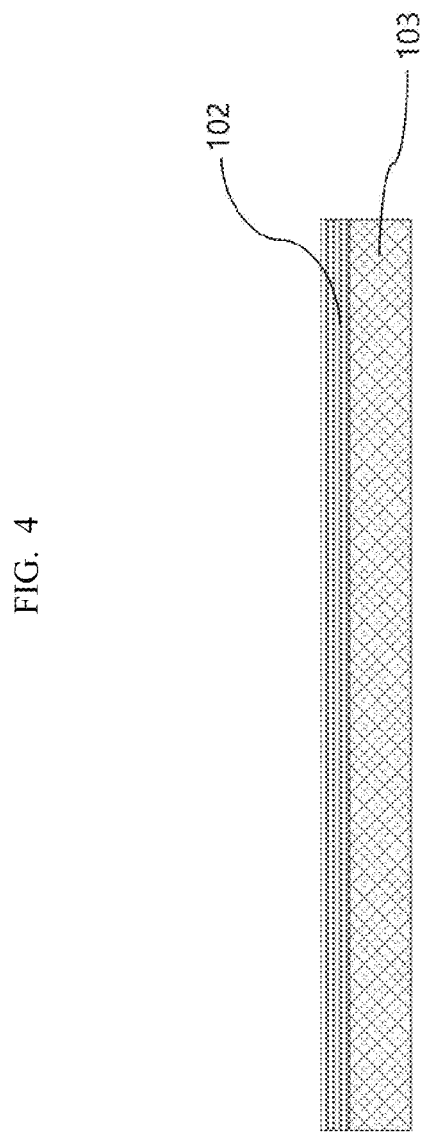
FIG. 4 illustrates a general printed circuit board layer including a circuit pattern layer 102 formed on one surface of the base material unit 103.

FIG. 4 illustrates a general printed circuit board layer including a circuit pattern layer 102 formed on one surface of the base material unit 103.

Figure 5:
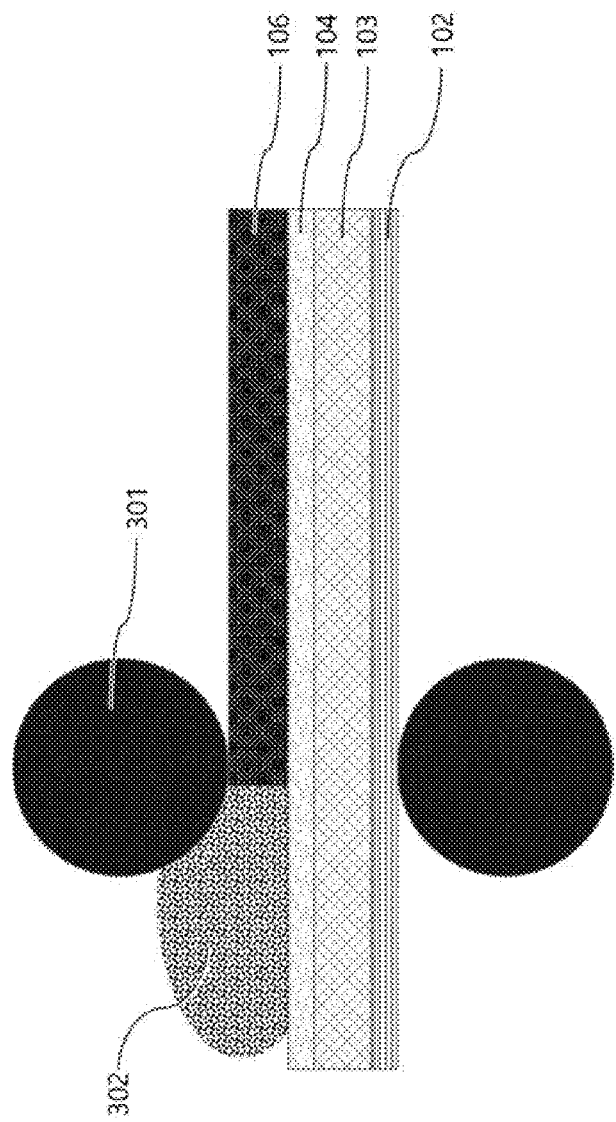
FIG. 5 illustrates a process of laminating a graphite layer 106 on one surface of a printed circuit board layer by disposing graphite powder 302 on an adhesive layer 104 on one surface of the base material unit 103 of the printed circuit board layer of FIG. 4 and then pressurizing the graphite powder in both directions of a circuit pattern layer 102 and a base material unit 103 with a roller 301.

FIG. 5 illustrates a process of laminating a graphite layer 106 on one surface of a printed circuit board layer by disposing graphite powder 302 on an adhesive layer 104 on one surface of the base material unit 103 of the printed circuit board layer 202 of FIG. 4 and then pressurizing the graphite powder in both directions of a circuit pattern layer 102 and a base material unit 103 with a roller 301.

Figure 6:
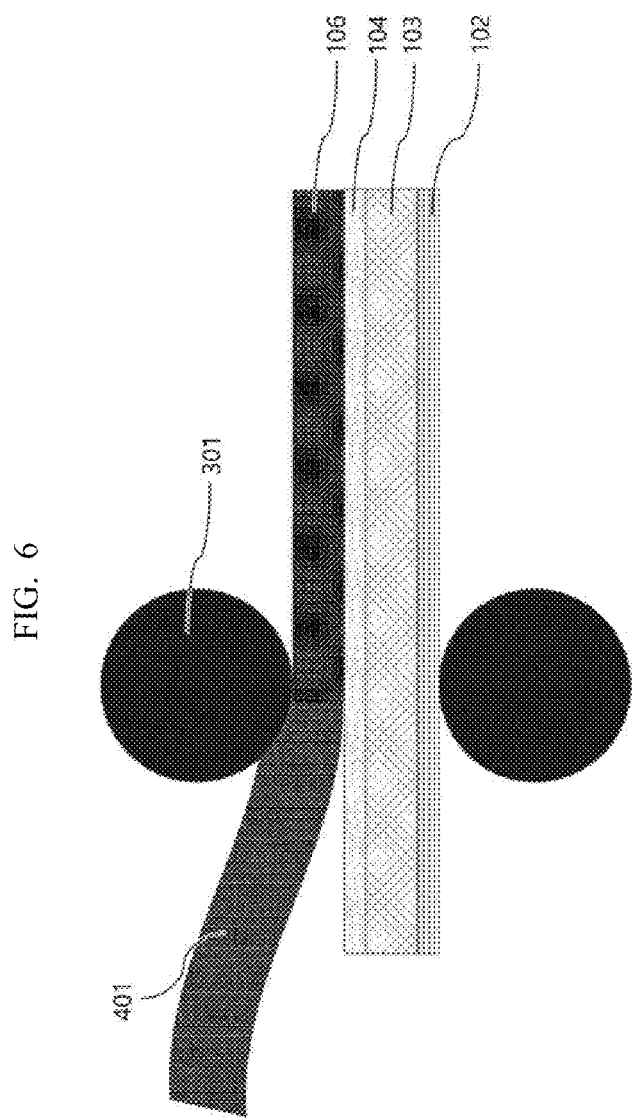
FIG. 6 illustrates a process of laminating a graphite layer 106 on one surface of a printed circuit board layer by disposing a graphite film 401 on an adhesive layer 104 on one surface of the base material unit 103 of the printed circuit board layer 202 of FIG. 4 and then pressurizing the graphite film in both directions of a circuit pattern layer 102 and a base material unit 103 with a roller 301.

FIG. 6 illustrates a process of laminating a graphite layer 106 on one surface of a printed circuit board layer by disposing a graphite film 401 on an adhesive layer 104 on one surface of the base material unit 103 of the printed circuit board layer of FIG. 4 and then pressurizing the graphite film in both directions of a circuit pattern layer 102 and a base material unit 103 with a roller 301.

In one embodiment of the present invention, the graphite film 401 may be an artificial graphite, and specifically, a carbonized polymer film.

In one embodiment of the present invention, the polymer film may be a polyimide film.

In one embodiment of the present invention, the carbonization is to perform a heat treatment method including a carbonizing step and a graphite step.

In one embodiment of the present invention, the carbonizing step includes a step of carbonizing the polymer film to be converted into a carbonaceous film by introducing a polyimide film into a first heater with a first temperature interval.

In one embodiment of the present invention, the first temperature interval is an interval in which the temperature sequentially rises to 500±50° C. to 1,000° C.

In one embodiment of the present invention, the graphite step includes a step of converting the carbonaceous film into a graphite film by introducing the carbonaceous film into a second heater having a second temperature interval in which the temperature linearly rises.

In one embodiment of the present invention, the second heater has a length of 4,000 mm to 6,000 mm.

In one embodiment of the present invention, the second temperature interval is an interval in which the temperature sequentially rises to 1,000° C. to 2,800° C.

In one embodiment of the present invention, the second temperature interval may include a second-first temperature interval of 1,000° C. to 1,500° C., a second-second temperature interval of 1,500° C. to 2,200° C., and a second-third temperature interval of 2,200° C. to 2,800° C.

In one embodiment of the present invention, the graphite step includes a step of moving the carbonaceous film in a transverse direction at 0.33 mm/sec to 1.33 mm/sec in the second-first temperature interval and performing a thermal treatment on the carbonaceous film for one to four hours while rising an internal temperature of the second heater to 1° C. to 5° C. per minute.

In one embodiment of the present invention, a thickness of the graphite layer 106 may be 5 μm to 40 μm.

In one embodiment of the present invention, adhesive layers 104 and 107 may be further provided between the graphite layer 106 and the printed circuit board layer.

In one embodiment, the adhesive layers 104 and 107 may be pressure sensitive adhesives (PSA) which show or enhance an adhesive activity when a pressure is applied and specifically, may be acrylic adhesives or polyimide, polyethylene terephthalate double-sided tapes.

In one embodiment of the present invention, the adhesive layers 104 and 107 may include conductive particles.

In one embodiment of the present invention, a thickness of the adhesive layers 104 and 107 may be 3.5 μm to 5 μm.

Figure 7:
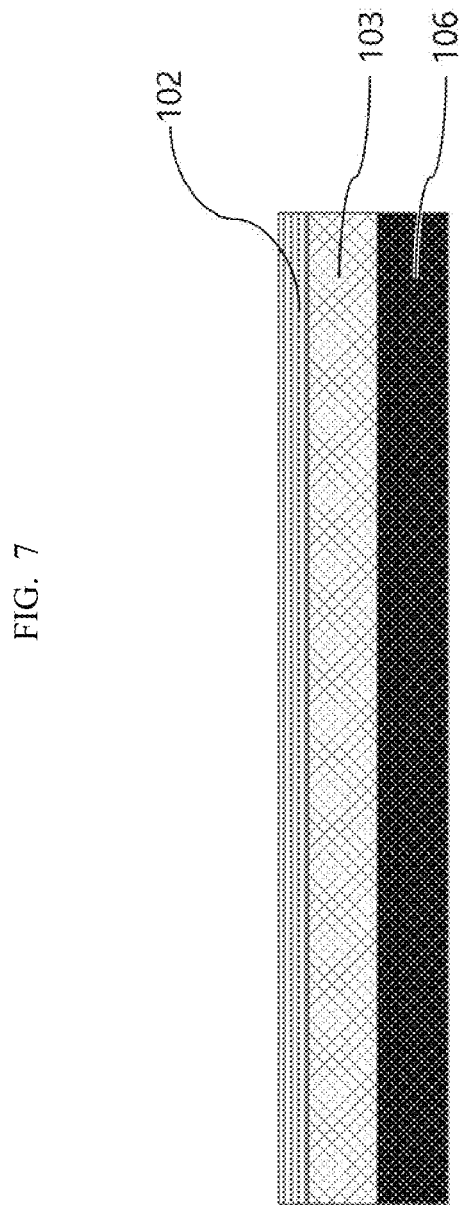
FIG. 7 illustrates an example of a film cross-section of a process of manufacturing a chip-on film type semiconductor package in which a graphite layer 106 is laminated on one surface of the base material unit 103 of the printed circuit board layer 202.

FIG. 7 illustrates an example of a film cross-section of a process of manufacturing a chip-on film type semiconductor package in which a graphite layer 106 is laminated on one surface of the base material unit 103 of the printed circuit board layer 202.

Figure 8:
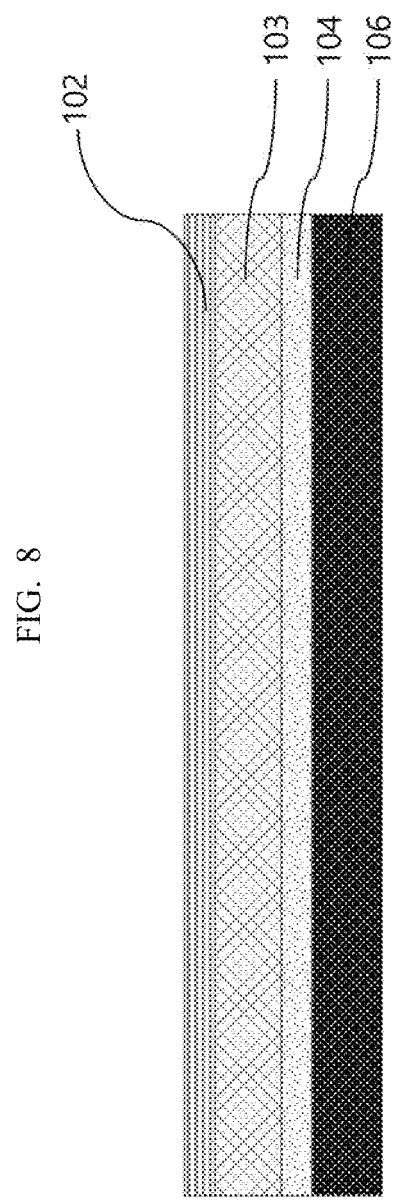
FIG. 8 illustrates an example of a film cross-section of a process of manufacturing a chip-on film type semiconductor package in which an adhesive layer 104 and a graphite layer 106 are sequentially laminated on one surface of the base material unit 103 of the printed circuit board layer.

FIG. 8 illustrates an example of a film cross-section of a process of manufacturing a chip-on film type semiconductor package in which an adhesive layer 104 and a graphite layer 106 are sequentially laminated on one surface of the base material unit 103 of the printed circuit board layer.

Figure 9:
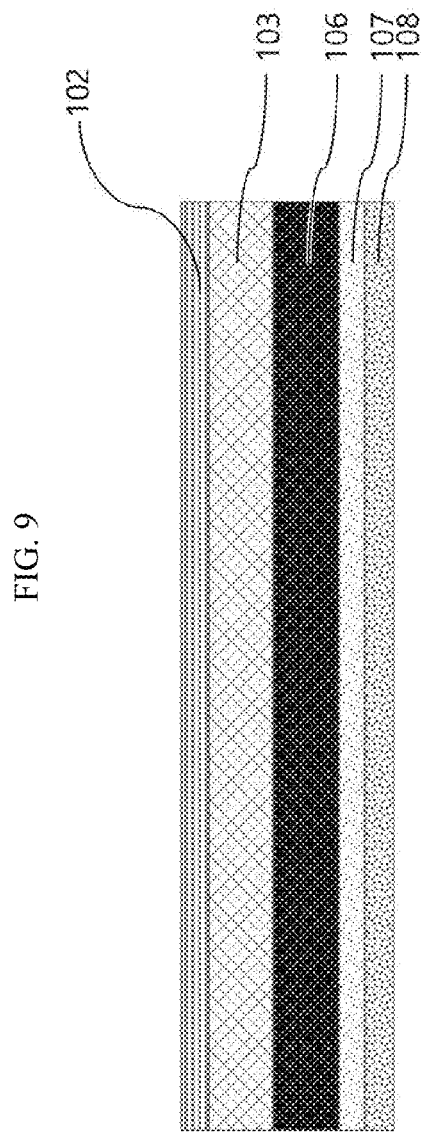
FIG. 9 illustrates an example of a film cross-section of a process of manufacturing a chip-on film type semiconductor package in which a graphite layer 106 is laminated on one surface of the base material unit 103 of the printed circuit board layer 202 and an adhesive layer 107 and a protective film layer 108 are sequentially laminated on one surface of the graphite layer 106 which is opposite to the base material unit 103.

FIG. 9 illustrates an example of a film cross-section of a process of manufacturing a chip-on film type semiconductor package in which a graphite layer 106 is laminated on one surface of the base material unit 103 of the printed circuit board layer 202 and an adhesive layer 107 and a protective film layer 108 are sequentially laminated on one surface of the graphite layer 106 which is opposite to the base material unit 103.

In one embodiment of the present invention, a protective film layer 108 may be further provided on one surface of the graphite layer 106.

In one embodiment of the present invention, the protective film layer 108 may be laminated on one surface of the graphite layer 106 which faces the base material unit 103 of the printed circuit board layer.

In one embodiment of the present invention, the protective film layer 108 may be an insulating film, and specifically, may be a polyester-based resin film and may include polyethylene terephthalate (PET), polybutylene terephthalate (PBT), polytrimethylene terephthalate (PTET), polycyclohexylene terephthalate (PCHT) and polyethylene naphthalate (PEN), or a combination thereof.

In one embodiment of the present invention, a thickness of the protective film layer 108 may be 1.5 μm to 3.0 μm.

Figure 10:
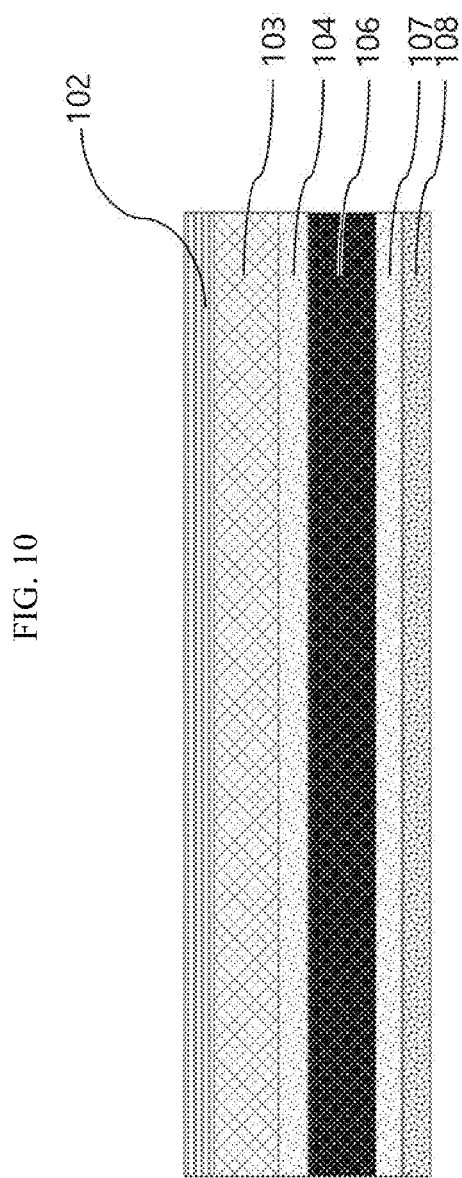
FIG. 10 illustrates an example of a film cross-section of a process of manufacturing a chip-on film type semiconductor package in which an adhesive layer 104 and a graphite layer 106 are sequentially laminated on one surface of the base material unit 103 of the printed circuit board layer and an adhesive layer 107 and a protective film layer 108 are sequentially laminated on one surface of the graphite layer 106 which is opposite to the base material unit 103.

FIG. 10 illustrates an example of a film cross-section of a process of manufacturing a chip-on film type semiconductor package in which an adhesive layer 104 and a graphite layer 106 are sequentially laminated on one surface of the base material unit 103 of the printed circuit board layer and an adhesive layer 107 and a protective film layer 108 are sequentially laminated on one surface of the graphite layer 106 which is opposite to the base material unit 103.

In one embodiment of the present invention, the protective film layer 108 may be laminated on one surface of the graphite layer 106 which is opposite to the base material unit 103 of the printed circuit board layer.

Figure 11:
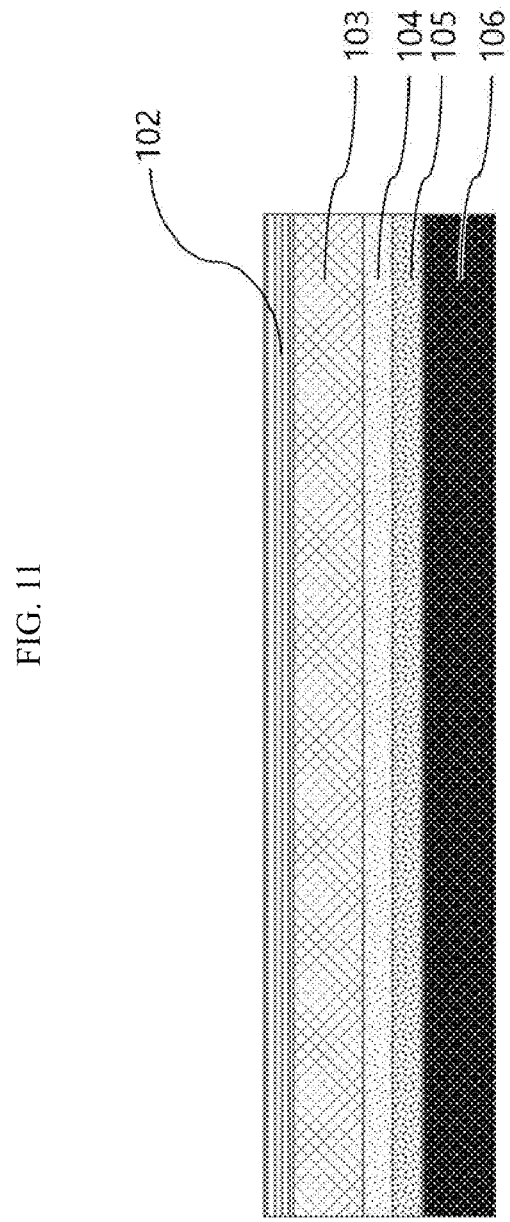
FIG. 11 illustrates an example of a film cross-section of a process of manufacturing a chip-on film type semiconductor package in which an adhesive layer 104 and a protective film layer 105 are laminated on one surface of the base material unit 103 of the printed circuit board layer and a graphite layer 106 is laminated on one surface of the protective film layer 105 which faces the base material unit 103.

FIG. 11 illustrates an example of a film cross-section of a process of manufacturing a chip-on film type semiconductor package in which an adhesive layer 104 and a protective film layer 105 are laminated on one surface of the base material unit 103 of the printed circuit board layer and a graphite layer 106 is laminated on one surface of the protective film layer 105 which faces the base material unit 103.

FIG. 1 illustrates an example of a cross-section of a chip-on film type semiconductor package in which a direction mounting element 109 is disposed on one surface of a circuit pattern layer 123 of a printed circuit board layer 202, a filling material 100 is filled in an empty space, and then an integrated circuit chip 101 is laminated on a film on which a graphite layer 106 is laminated on one surface of a base material unit 103 of the printed circuit board layer 202 of FIG. 7.

Figure 12:
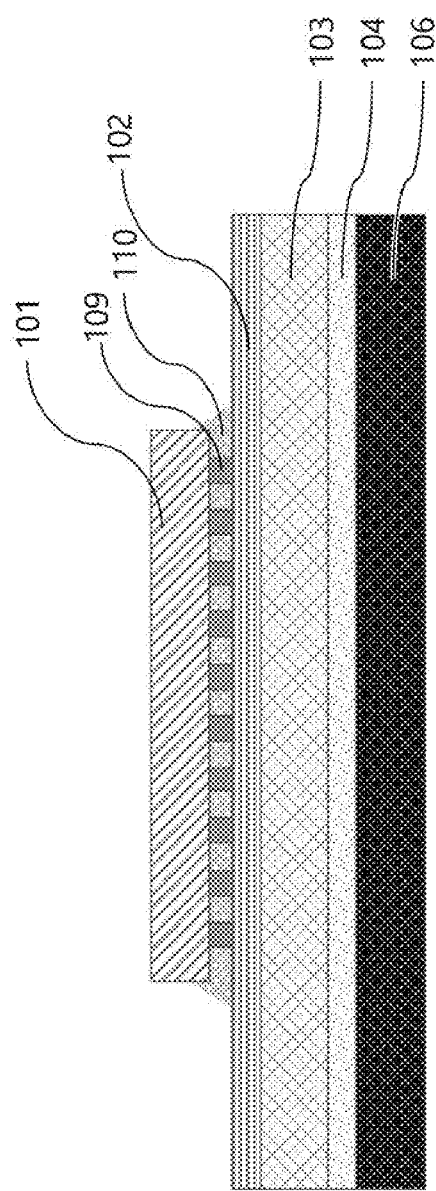
FIG. 12 illustrates an example of a cross-section of a chip-on film type semiconductor package in which a direction mounting element 109 is disposed on one surface of a circuit pattern layer 123 of a printed circuit board layer, a filling material 100 is filled in an empty space, and then an integrated circuit chip 101 is laminated on a film on which an adhesive layer 104 and a graphite layer 106 are sequentially laminated on one surface of a base material unit 103 of the printed circuit board layer 202 of FIG. 8.

FIG. 12 illustrates an example of a cross-section of a chip-on film type semiconductor package in which a direction mounting element 109 is disposed on one surface of a circuit pattern layer 123 of a printed circuit board layer, a filling material 100 is filled in an empty space, and then an integrated circuit chip 101 is laminated on a film on which an adhesive layer 104 and a graphite layer 106 are sequentially laminated on one surface of a base material unit 103 of the printed circuit board layer of FIG. 8.

Figure 13:
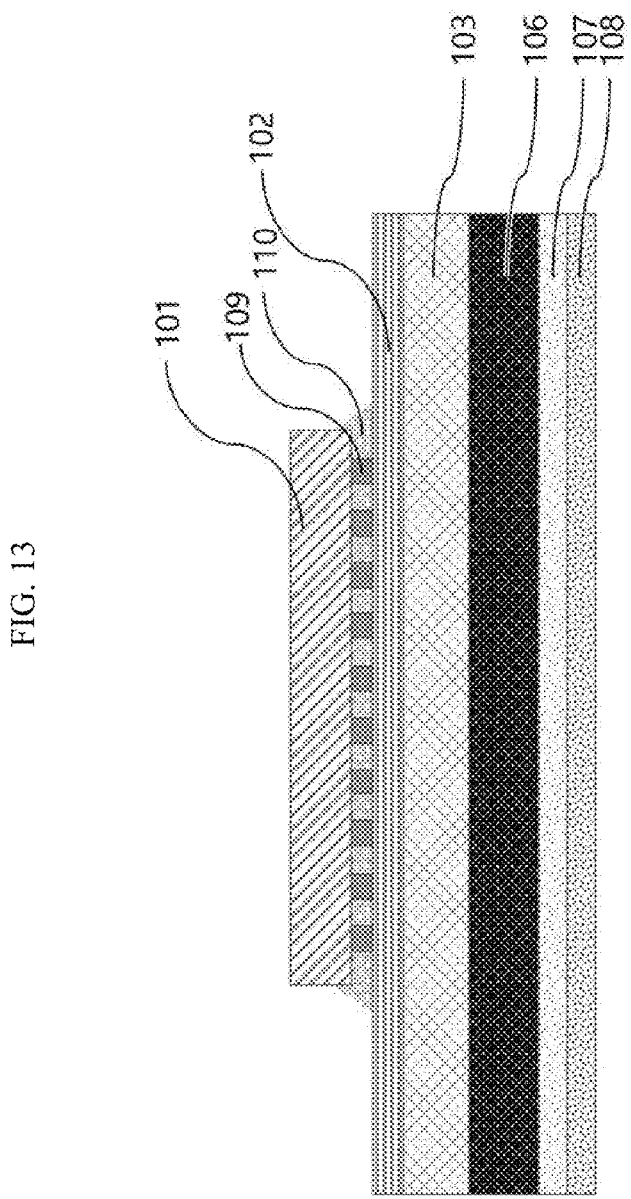
FIG. 13 illustrates an example of a cross-section of a chip-on film type semiconductor package in which a direction mounting element 109 is disposed on one surface of a circuit pattern layer 123 of a printed circuit board layer, a filling material 100 is filled in an empty space, and then an integrated circuit chip 101 is laminated on a film on which a graphite layer 106 is laminated on one surface of a base material unit 103 of the printed circuit board layer 202 of FIG. 9.

FIG. 13 illustrates an example of a cross-section of a chip-on film type semiconductor package in which a direction mounting element 109 is disposed on one surface of a circuit pattern layer 123 of a printed circuit board layer, a filling material 100 is filled in an empty space, and then an integrated circuit chip 101 is laminated on a film on which a graphite layer 106 is laminated on one surface of a base material unit 103 of the printed circuit board layer of FIG. 9.

Figure 14:
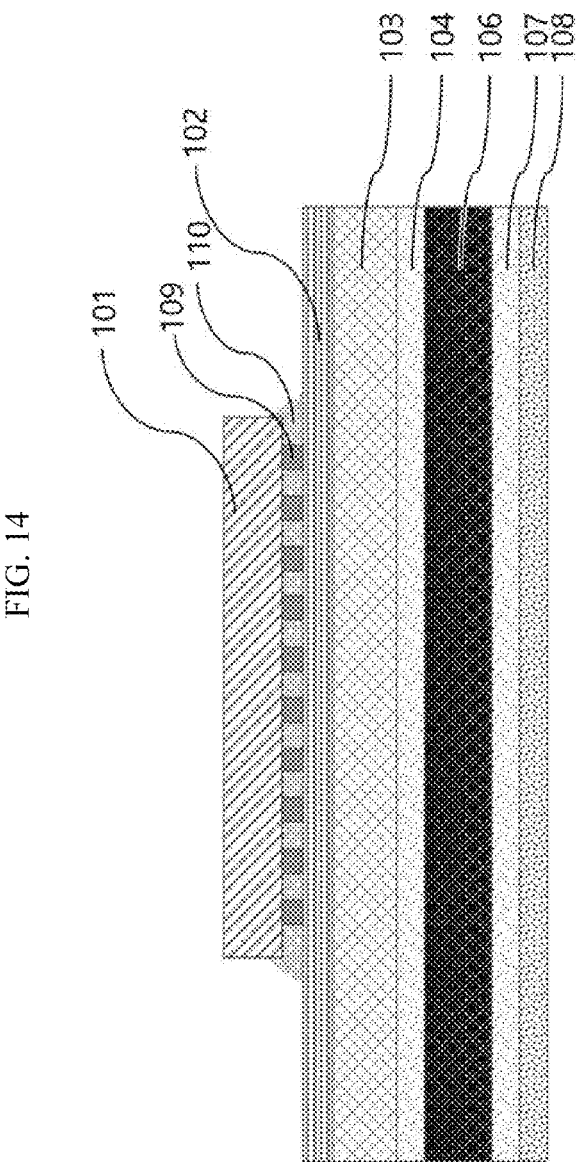
FIG. 14 illustrates an example of a cross-section of a chip-on film type semiconductor package in which a direction mounting element 109 is disposed on one surface of a circuit pattern layer 123 of a printed circuit board layer, a filling material 100 is filled in an empty space, and then an integrated circuit chip 101 is laminated on a film on which an adhesive layer 104 and a graphite layer 106 are sequentially laminated on one surface of a base material unit 103 of the printed circuit board layer of FIG. 10 and an adhesive layer 107 and a protective film layer 108 are sequentially laminated on one surface of the graphite layer 106 which is opposite to the base material unit 103.

FIG. 14 illustrates an example of a cross-section of a chip-on film type semiconductor package in which a direction mounting element 109 is disposed on one surface of a circuit pattern layer 123 of a printed circuit board layer, a filling material 100 is filled in an empty space, and then an integrated circuit chip 101 is laminated on a film on which an adhesive layer 104 and a graphite layer 106 are sequentially laminated on one surface of a base material unit 103 of the printed circuit board layer of FIG. 10 and an adhesive layer 107 and a protective film layer 108 are sequentially laminated on one surface of the graphite layer 106 which is opposite to the base material unit 103.

In one embodiment of the present invention, the protective film layer 108 may be laminated on one surface of the graphite layer 106 which is opposite to the base material unit 103 of the printed circuit board layer.

Figure 15:
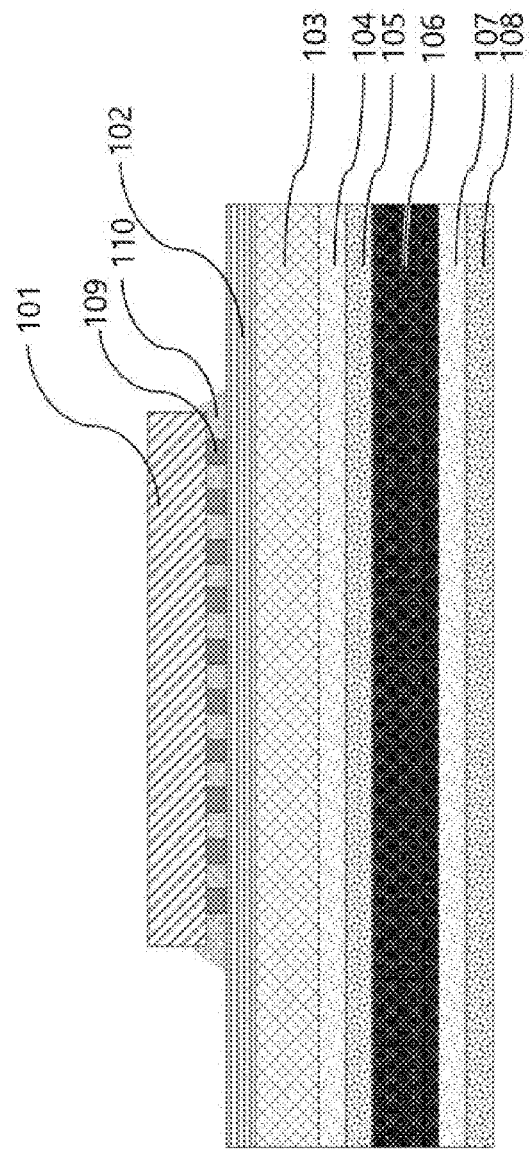
FIG. 15 illustrates an example of a cross-section of a chip-on film type semiconductor package in which a direction mounting element 109 is disposed on one surface of a circuit pattern layer 123 of a printed circuit board layer 202, a filling material 100 is filled in an empty space, and then an integrated circuit chip 101 is laminated on a film on which an adhesive layer 104 and a protective film layer 105 are laminated on one surface of a base material unit 103 of the printed circuit board layer 202 of FIG. 11 and a graphite layer 106 is laminated on one surface of the protective film layer 105 which faces the base material unit 103.

FIG. 15 illustrates an example of a cross-section of a chip-on film type semiconductor package in which a direction mounting element 109 is disposed on one surface of a circuit pattern layer 123 of a printed circuit board layer, a filling material 100 is filled in an empty space, and then an integrated circuit chip 101 is laminated on a film on which an adhesive layer 104 and a protective film layer 105 are laminated on one surface of a base material unit 103 of the printed circuit board layer of FIG. 11 and a graphite layer 106 is laminated on one surface of the protective film layer 105 which faces the base material unit 103.

Figure 16:
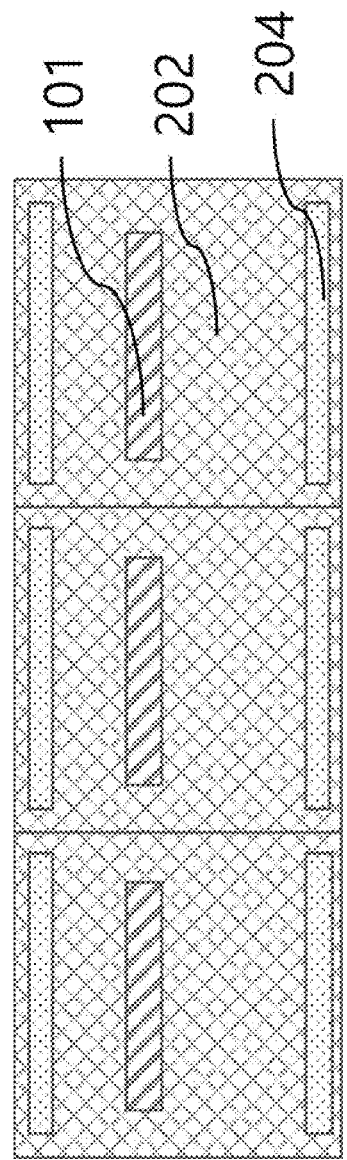
FIG. 16 illustrates a chip-on film type semiconductor package with a structure in which an integrated circuit chip 101 connected to one surface of a printed circuit board layer 202 directly or by means of a mounting element and an outer lead bonder pad 204 are disposed to be parallel to a length direction of the integrated circuit as a plan view in an upper direction.

FIG. 16 illustrates a chip-on film type semiconductor package with a structure in which an integrated circuit chip 101 connected to one surface of a printed circuit board layer 202 directly or by means of a mounting element and an outer lead bonder pad 204 are disposed to be parallel to a length direction of the integrated circuit as a plan view in an upper direction.

The outer lead bonder pad 204 is located on one surface of the printed circuit board layer.

As long as the outer lead bonder pad 204 electrically connects a circuit of the printed circuit board layer 202 and a display panel, the outer lead bonder pad is not limited and a material thereof may be gold, copper, nickel, or a combination thereof.

In one embodiment of the present invention, the outer lead bonder pad 204 may be disposed to be parallel to a length direction of the integrated circuit.

In one embodiment of the present invention, the graphite layer 106 may be laminated in an area excluding an opposite surface of an area of the printed circuit board layer 202 in which the outer lead bonder pad is disposed. In the chip-on film type semiconductor package with this structure, a visibility of the outer lead bonder pad 204 disposed on the printed circuit board layer 202 in a direction in which the graphite layer 203 is laminated is improved so that the outer lead bonder pad 204 is visibly identified in the direction of the graphite layer 203 with naked eyes. Therefore, the visibility is improved and a bonding precision and a bonding strength during the outer lead bonding process (OLB process) are improved.

Figure 17:
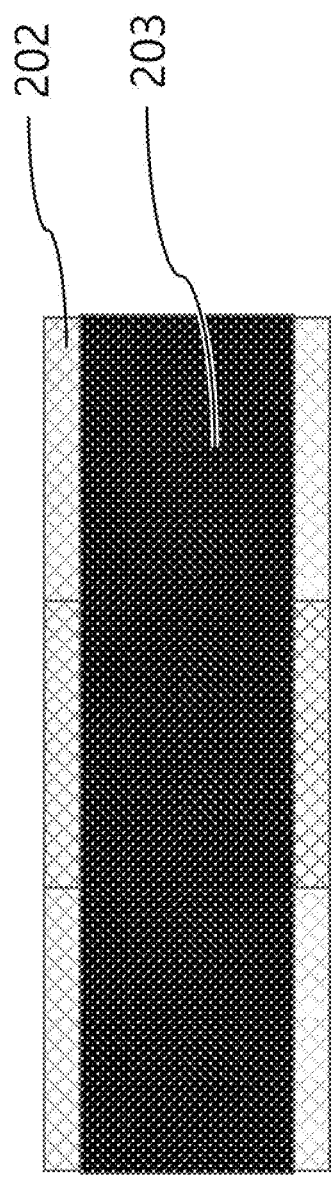
FIG. 17 illustrates a chip-on film type semiconductor package with a structure in which the outer lead bonder pad 204 of FIG. 16 is disposed to be parallel to a length direction of an integrated circuit chip 101 of FIG. 16 and the graphite layer 203 is laminated in an area excluding an opposite surface of the area of the printed circuit board layer 202 on which the outer lead bonder pad 204 of FIG. 16. is disposed as a plan view in a lower direction in which the graphite layer is laminated.

FIG. 17 illustrates a chip-on film type semiconductor package with a structure in which the outer lead bonder pad 204 of FIG. 16 is disposed to be parallel to a length direction of an integrated circuit chip 101 of FIG. 16 and the graphite layers 203 is laminated in an area excluding an opposite surface of the area of the printed circuit board layer 202 of FIG. 16 on which the outer lead bonder pad 204 of FIG. 16 is disposed as a plan view in a lower direction in which the graphite layer is laminated.

In one embodiment of the present invention, two or more graphite layers 203 may be laminated to be spaced apart from each other. In this case, individual unit sections of the integrated circuit chip are divided even in the direction of the graphite layer 203 so that a bonding precision and a bonding strength during the outer lead bonding process (OLB process) are improved.

Figure 18:
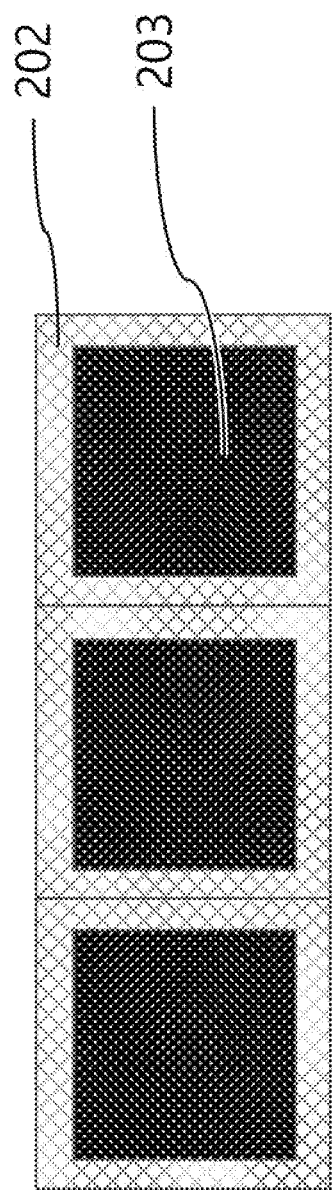
FIG. 18 illustrates a chip-on film type semiconductor package with a structure in which the outer lead bonder pad is disposed to be parallel to a length direction of an integrated circuit chip 101 of FIG. 16 and the graphite layers 203 are laminated to be spaced apart from each other in an area excluding an opposite surface of the area of the printed circuit board layer 202 on which the outer lead bonder pad 204 of FIG. 16 is disposed as a plan view in a lower direction in which the graphite layer is laminated.

FIG. 18 illustrates a chip-on film type semiconductor package with a structure in which the outer lead bonder pad is disposed to be parallel to a length direction of an integrated circuit chip 101 of FIG. 16 and the graphite layers 203 are laminated to be spaced apart from each other in an area excluding an opposite surface of the area of the printed circuit board layer 202 of FIG. 16 on which the outer lead bonder pad 204 of FIG. 16 is disposed as a plan view in a lower direction in which the graphite layer is laminated.

In one embodiment of the present invention, the integrated circuit chip 101 may be disposed to be parallel to a length direction of the printed circuit board layer 202 of FIG. 16. In this case, even though a structure in which the graphite layer 106 is laminated in an area excluding an opposite surface of an area of the printed circuit board layer 202 on which the outer lead bonder pad is disposed is employed to visibly identify the outer lead bonder pad with naked eyes even in the direction of the graphite layer 203, a continuous pressurizing process on the printed circuit board layer 202 of FIG. 16 by a roll to roll/reel process to reel is possible when the graphite layer 203 is laminated to improve the workability while improving the visibility, the bonding precision, and the bonding strength.

In one embodiment of the present invention, in a state in which the printed circuit board layer 202 and the graphite layer 203 are wound on a roll in the form of a film, both surfaces are pressurized by two rollers 301 to be primarily laminated by a roll to roll/reel to reel process. In this case, a pressure of the roller may be 3 to 3 kg. Further, a carrier film may be supplied on one surface of the graphite layer 203 by a roll to roll process to be laminated and a primarily laminated film may be laminated in the order of the printed circuit board layer 202/the graphite layer 106/the carrier film layer (not illustrated) or the printed circuit board layer 202/the adhesive layer 104/the graphite layer 203/the carrier film layer (not illustrated).

In one embodiment of the present invention, in a state in which the primarily laminated film and the adhesive layers 104 and 107 are wound on a roll in the form of a film, both surfaces may be pressurized to be secondarily laminated by the roll to roll/reel to reel process. In this case, a pressure of the roller may be 3 to 20 kg. Further, a release film may be supplied on one surface of the graphite layer 106 by a roll to roll process to be laminated and a secondarily laminated film may be laminated in the order of the printed circuit board layer 202/the adhesive layer 104/the graphite layer 106/the adhesive layer 107/the release film layer (not illustrated) or the printed circuit board layer 202/the adhesive layer 107/the graphite layer 106/the release film layer (not illustrated).

In one embodiment of the present invention, in a state in which the secondarily laminated film and the protective film layers 105 and 108 are wound on a roll in the form of a film, both surfaces are pressurized to be secondarily laminated by the roll to roll/reel to reel process. In this case, the pressure of the roller may be 3 to 20 kg and a temperature of the roller may be 70 to 90° C. Further, a tertiary laminated film may be laminated in order of the printed circuit board layer 202/the adhesive layer 104/the graphite layer 106/the adhesive layer 107/the protective film layer 108 or the printed circuit board layer 202/the adhesive layer 107/the graphite layer 106/the protective film layer 108.

Hereinafter, a display device including the above described chip-on film type semiconductor package, a substrate, and a display panel will be described.

In one embodiment of the present invention, the substrate may be electrically connected to an outer lead bonder pad of the chip-on film type semiconductor package.

In one embodiment of the present invention, the substrate may further include an outer lead bonder pad (not illustrated) and may be electrically connected to the outer lead bonder pad of the chip-on film type semiconductor package.

In one embodiment of the present invention, the substrate may further include an outer lead bonder pad (not illustrated) and may be electrically connected to the outer lead bonder pad of the chip-on film type semiconductor package. In this case, an anisotropic conductive film (ACF) layer may be further provided between the outer lead bonder pad (not illustrated) of the substrate and the outer lead bonder pad of the chip-on film type semiconductor package. The outer lead bonder pad (not illustrated) of the substrate/the anisotropic conductive film layer/the outer lead bonder pad of the chip-on film type semiconductor package are sequentially disposed and then laminated by an outer lead bonding process (OLB process).

In one embodiment of the present invention, the display panel may be a liquid crystal display or a light emitting diode display and a configuration module may include a module of a display panel which is generally used.

The chip-on film type semiconductor package is electrically connected to the substrate and the display panel to control a corresponding pixel of the display panel, in accordance with a driving signal of the integrated circuit chip, to be driven by an electrical signal.

The above description should be construed as examples of embodiments rather than limiting the scope of the invention. Therefore, the invention is not determined by the described matters, but may be determined by the claims and equivalents to the claims.

The invention claimed is:

1. A chip-on film type semiconductor package, comprising:
    an integrated circuit chip;
    a printed circuit board layer;
    an outer lead bonder pad; and
    a graphite layer,
    wherein the integrated circuit chip is connected to one surface of the printed circuit board layer directly or by a mounting element, the outer lead bonder pad is located on one surface of the printed circuit board layer, the graphite layer is laminated on an opposite surface of the printed circuit board layer, the integrated circuit chip is to be parallel to a length direction of the printed circuit board layer, the graphite layer is laminated in an area excluding an opposite surface of an area of the printed circuit board layer in which the outer lead bonder pad is disposed, and the integrated circuit chip is a display driver integrated circuit chip.

2. The chip-on film type semiconductor package of claim 1, further comprising:
    an adhesive layer between the graphite layer and the printed circuit board layer.

3. The chip-on film type semiconductor package of claim 1, wherein a protective film layer on one surface of the graphite layer.

4. The chip-on film type semiconductor package of claim 1, wherein a thickness of the graphite layer is 5 μm to 40 μm.

5. The chip-on film type semiconductor package of claim 1, wherein the graphite layer is a carbonized polymer film or a film formed of graphite powder.

6. The chip-on film type semiconductor package of claim 1, wherein the outer lead bonder pad is disposed to be parallel to a length direction of the integrated circuit.

7. The chip-on film type semiconductor package of claim 1, wherein the graphite layer is laminated in an area excluding an opposite surface of an area of the printed circuit board layer in which the outer lead bonder pad is disposed.

8. The chip-on film type semiconductor package of claim 1, wherein the graphite layer is laminated on both surfaces of the printed circuit board layer.

9. A display device, comprising:
    the chip-on film type semiconductor package comprising:
        an integrated circuit chip;
        a printed circuit board layer;
        an outer lead bonder pad; and
        a graphite layer,
        wherein the integrated circuit chip is connected to one surface of the printed circuit board layer directly or by means of a mounting element, the outer lead bonder pad is located on one surface of the printed circuit board layer, the graphite layer is laminated on an opposite surface of the printed circuit board layer, the integrated circuit chip is to be parallel to a length direction of the printed circuit board layer, the graphite layer is laminated in an area excluding an opposite surface of an area of the printed circuit board layer in which the outer lead bonder pad is disposed, and the integrated circuit chip is a display driver integrated circuit chip; and
    a substrate; and
    a display panel.

10. The display device of claim 9, further comprising:
    an adhesive layer between the graphite layer and the printed circuit board layer.

11. The display device of claim 9, wherein a protective film layer on one surface of the graphite layer.

12. The display device of claim 9, wherein a thickness of the graphite layer is 5 μm to 40 μm.

13. The display device of claim 9, wherein the graphite layer is a carbonized polymer film or a film formed of graphite powder.

14. The display device of claim 9, wherein the outer lead bonder pad is disposed to be parallel to a length direction of the integrated circuit.

15. The display device of claim 9, wherein the graphite layer is laminated in an area excluding an opposite surface of an area of the printed circuit board layer in which the outer lead bonder pad is disposed.

16. The display device of claim 9, wherein the graphite layer is laminated on both surfaces of the printed circuit board layer.

* * * * *